(12) United States Patent
Chen et al.

(10) Patent No.: US 6,573,187 B1
(45) Date of Patent: Jun. 3, 2003

(54) METHOD OF FORMING DUAL DAMASCENE STRUCTURE

(75) Inventors: Sheng-Hsiung Chen, Tai chung (TW); Ming-Hsing Tsai, Taipei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/378,458

(22) Filed: Aug. 20, 1999

(51) Int. Cl.⁷ .................. H01L 21/302; H01L 21/311
(52) U.S. Cl. .................. 438/692; 438/699; 438/700; 438/723; 438/724
(58) Field of Search .................. 438/692, 700, 438/689, 699, 723, 724

(56) References Cited

U.S. PATENT DOCUMENTS

| | | | |
|---|---|---|---|
| 5,614,765 A | 3/1997 | Avanzino et al. | 257/774 |
| 5,635,423 A | 6/1997 | Huang et al. | 438/642 |
| 5,686,354 A | 11/1997 | Avanzino et al. | 216/18 |
| 5,705,430 A | 1/1998 | Avanzino et al. | 438/618 |
| 5,795,823 A | 8/1998 | Avanzino et al. | 438/639 |
| 5,877,076 A | 3/1999 | Dai | 438/597 |
| 5,882,996 A | 3/1999 | Dai | 438/597 |

OTHER PUBLICATIONS

Wolf et al., Silicon Processing for VLSI Era, vol. 1—Process Technology, Lattice Press, USA, 1986, p. 407.*

* cited by examiner

*Primary Examiner*—Benjamin L. Utech
*Assistant Examiner*—Lynette T. Umez-Eronini
(74) *Attorney, Agent, or Firm*—George O. Saile; Stephen B. Ackerman

(57) ABSTRACT

A new method is provided for creating a dual damascene structure. Two layers of dielectric are deposited in sequence. The lower layer of dielectric is the via dielectric and is selected such that it has a low etching rate (when compared with the upper layer of dielectric) and results in different volatile gas during the etch of the via. A first photoresist is patterned for the via, the etch for the via etches through both layers of dielectric. A second layer of photoresist is patterned for the trench etch, due to the difference in etch rate between the two layers of dielectric, the trench of the dual damascene structure is etched without further affecting the via etch in the lower layer of dielectric.

7 Claims, 3 Drawing Sheets

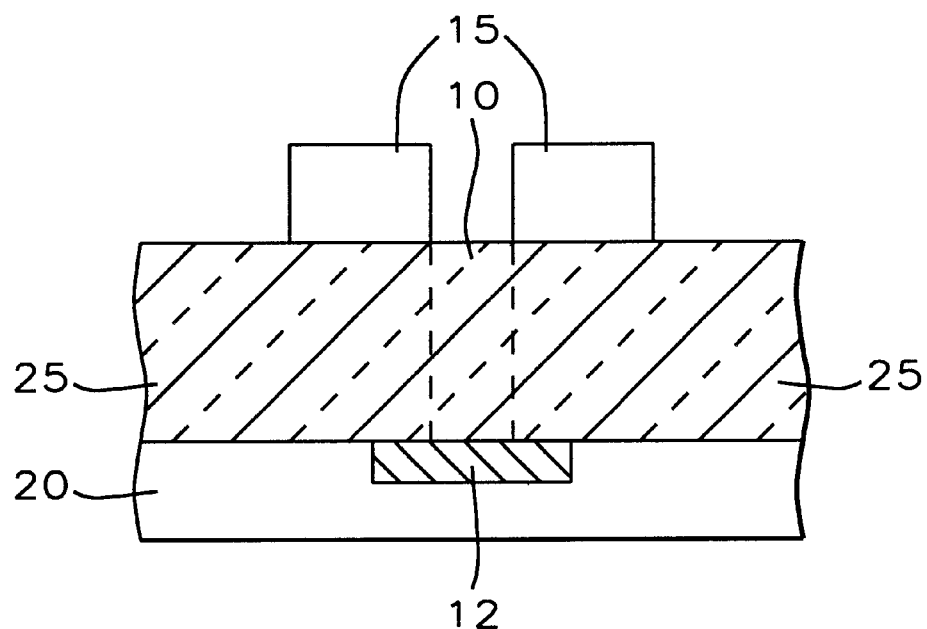
FIG. 1 – Prior Art
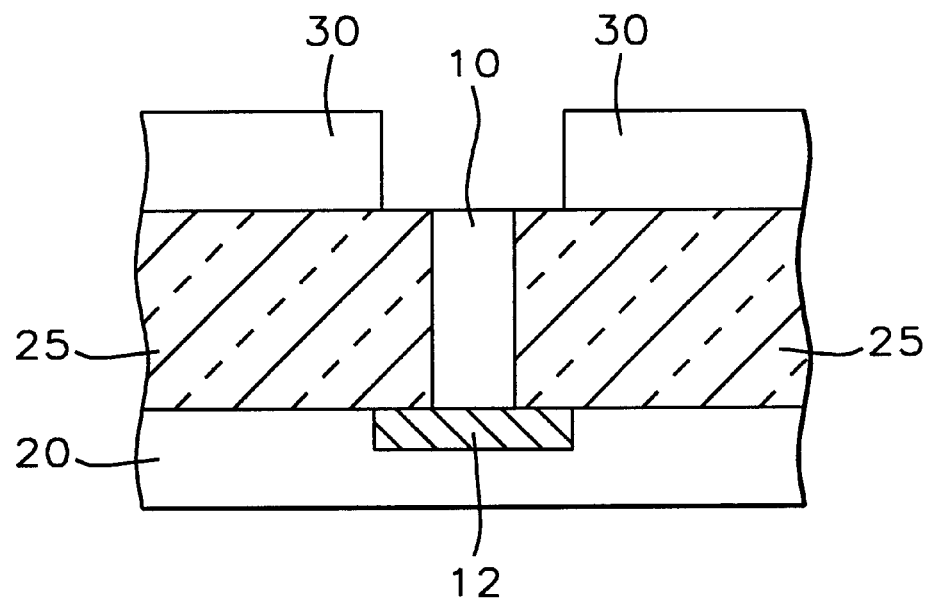
FIG. 2 – Prior Art

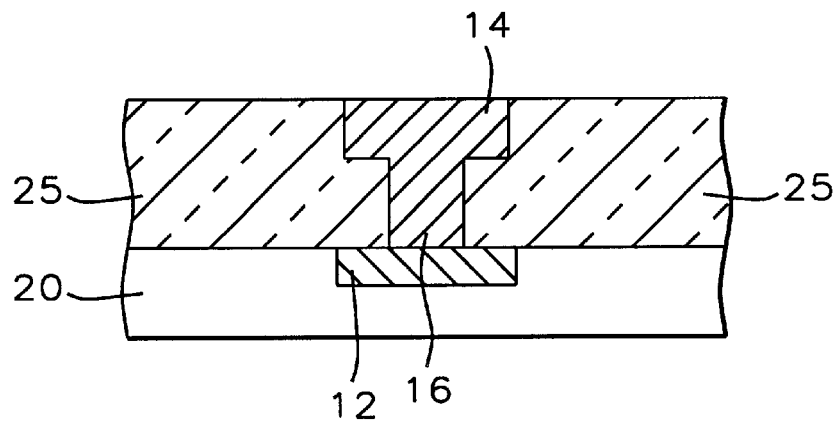
FIG. 3 – Prior Art
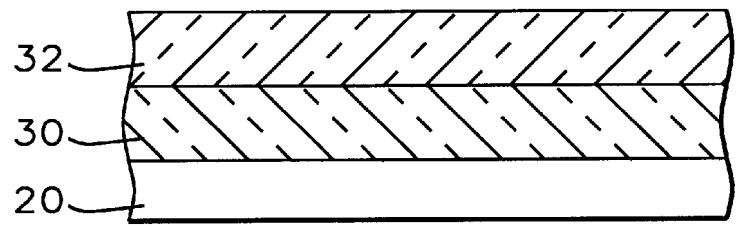
FIG. 4
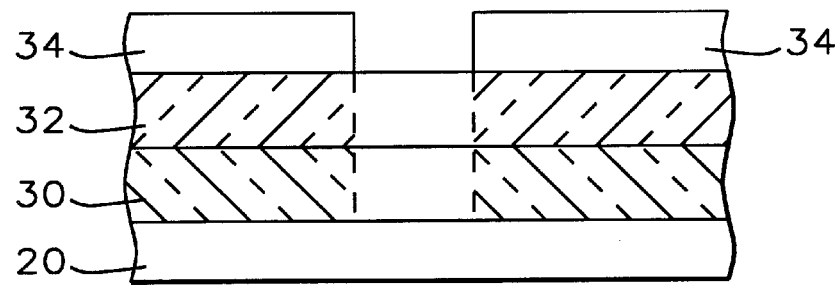
FIG. 5

US 6,573,187 B1

METHOD OF FORMING DUAL DAMASCENE STRUCTURE

BACKGROUND OF THE INVENTION (1) Field of the Invention

The invention relates to the fabrication of integrated circuit devices, and more particularly, to a new method of forming a dual damascene structure.

(2) Description of the Prior Art

One of the more important aspects of creating integrated circuit devices is the creation of metal interconnects that provide paths of electrical connectivity between the various components of the device. In view of the ever continuing decrease in device feature dimensions, these metal interconnects become relatively more important and can have profound impacts on the overall device performance. It is, for instance, highly desirable to achieve high wiring and packaging densities which brings with it the necessity to fabricate a multilayer structure on the substrate to connect integrated circuits to one another. These multi layer structures are separated by dielectric or insulating layers such as a polyimide. Via holes are created between adjacent layers of wiring that provide electrical connections between signal lines or to the metal power and ground planes. The design of the interconnect wiring network and the connecting points between these networks must adhere to strict design rules in order to maintain or enhance device performance while reducing device size and increasing device density. It is, for instance important to maintain good planarity between adjacent layers since lack of good planarity will have an increasingly negative effect on the planarity of overlying layers. Also, adjacent layers are ordinarily formed so that the primary signal propagation directions are orthogonal to each other. One of the design approaches that has been used for some time to create interconnect metal is the damascene and its extension the dual damascene process.

With the damascene process a metal via plug is first formed in a surface, typically the surface of a semiconductor substrate. A layer of dielectric (for instance $SiO_2$) is deposited over the surface (using for instance PECVD technology); trenches (for metal lines) are formed in the dielectric (using for instance RIE technology). Metal is deposited to fill the trenches; the excess metal on the surface is removed. A planar structure of interconnect lines with metal inlays in the (intra-level) dielectric is achieved in this manner.

An extension of the damascene process is the dual damascene process whereby an insulating or dielectric material, such as silicon oxide, is patterned with several thousand openings for the conductive lines and vias, which are filled at the same time with metal. Damascene is an interconnection fabrication process in which grooves are formed in an insulating layer and filled with metal to form the conductive lines. Dual damascene is a multi-level interconnection process in which, in-addition to forming the grooves of single damascene, conductive via openings also are formed. One of the dual damascene approaches uses a dielectric layer that is formed by three consecutive depositions whereby the central layer functions as an etch stop layer. This etch stop layer can be SiN, the top and bottom layer of this three layer configuration can be $SiO_2$. This triple layer dielectric allows first forming the vias by resist patterning the vias and etching through the three layers of dielectric. The conductive pattern can then be formed in the top layer of dielectric whereby the central layer of SiN forms the stop layer for the etch of the conducting pattern. Another approach, still using the three-layer dielectric formed on the substrate surface, is to first form the pattern for the conducting lines in the top layer of the dielectric whereby the SiN layer again serves as etch stop. The vias can then be formed by aligning the via pattern with the pattern of the conducting lines and patterning and etching the vias through the etch stop layer of SiN and the first layer of dielectric. Yet another approach is to deposit the three layer dielectric in two steps, first depositing the first layer of $SiO_2$ and the etch stop layer of SiN. At this point the via pattern can be exposed and etched. The top layer of $SiO_2$ dielectric is then deposited; the conducting lines are now patterned and etched. The SiN layer will stop the etching except where the via openings have already been etched.

Yet another approach to forming the dual damascene structure is to form an insulating layer that is coated with a photoresist. The photoresist is exposed through a first mask with image pattern of the via openings, this via pattern is anisotropically etched in the upper half of the insulating layer. The photoresist now is exposed through a second mask with an image pattern of the conductive line. The pattern of the conducting lines is aligned with the pattern of the vias thereby encompassing the via openings. In anisotropically etching the openings for the conductive lines in the upper half of the insulating material, the via openings already present in the upper half are simultaneously etched and replicated in the lower half of the insulating material.

With the dual damascene process, the conductive line pattern and the vias are filled with metal at the same time which represents an improvement over the damascene process in that the dual damascene process has fewer processing steps.

In a typical dual damascene process, the dual damascene structure can be formed by etching the vias after which the trenches are etched. After the vias have been etched, a stop layer of for instance SiN or SiON can be deposited to serve as etch stop for the etching of the trenches. The disadvantage of the deposition of the stop layer is that SiN or SiON have a high dielectric constant resulting in an increase in the dielectric constant of the dual damascene structure. This is contrary to the design requirement of providing dielectric layers between conducting metal that have a dielectric constant that is as low as possible, ideally the dielectric constant of a vacuum. Another approach that has been highlighted above in creating the dual damascene structure is to etch the trench prior to creating the vias. The disadvantage of this approach is that the Depth of Focus (DOF) in creating the vias is too high for accurate photolithographic exposure of the vias.

The invention addresses these problems by teaching a method for creating a dual damascene structure that does not result in an increase of the dielectric constant of the intra-level dielectric and without having a negative impact on the contour definition of the via etch of this structure.

FIG. 1 provides an overview of the Prior Art method of creating a dual damascene structure. FIG. 1 shows a cross section of the opening that is etched through the layer 25 of intra-level dielectric. This intra-level dielectric 25 is deposited on a surface 20, typically the surface of a substrate. It is the objective of the dual damascene structure to make electrical contact with a point 12 of metal, for instance aluminum, in the surface 20 over which it is created. A layer 15 of photoresist has been deposited and patterned (to the width of the to be created via opening) on the surface of the dielectric 25.

FIG. 2 shows a cross section whereby a second layer 30 of photoresist has been deposited and patterned on the surface of the intra-level layer of dielectric 25. The width of the pattern that is created in the photoresist is equal to the width of the trench that needs to be etched in the upper region of the intra-level dielectric.

FIG. 3 shows a cross section whereby the pattern in the photoresist has been etched into the upper regions of the dielectric region of the layer 25. The width of this trench 14 is equal to the width of the pattern created in the second layer of photoresist. The width of the via 16 is the width of the opening etched in the first layer of photoresist. The depth of the trench can be controlled by means of a stop layer or by time control of the etch for the trench or by etch parameters such as the type of etchant that is used for opening the trench.

U.S. Pat. No. 5,792,823 (Avanzino et al.), U.S. Pat. No. 5,614,765 (Avanzino et al.) and U.S. Pat. No. 5,705,430 (Avanzino et al.) show dual damascene etch process with 2 IMD layers.

U.S. Pat. No. 5,882,996 (Dai), U.S. Pat. No. 5,877,076 (Dai), U.S. Pat. No. 5,686,354 (Avanzino et al.) and U.S. Pat. No. 5,635,423 (Huang et al.) show dual damascene process with 2 IMD layers and etch stop layers.

SUMMARY OF THE INVENTION

A principle objective of the invention is to create a dual damascene structure without increasing the dielectric constant of the dielectric between the interconnect line pattern.

Another objective of the invention is to provide a method of forming a dual damascene structure that does not use a stop layer for the trench etch while maintaining good trench etch end-point detection.

Yet another objective of the invention is to provide a method that allows for etching the trench of the dual damascene structure with high selectivity.

In accordance with the objectives of the invention a new method is provided for creating a dual damascene structure. Two layers of dielectric are deposited in sequence. The lower dielectric is the via dielectric and is selected such that it has a low etching rate and results in different volatile gas during the etch of the via. A first photoresist is patterned for the via, the etch for the via etches through both layers of dielectric. A second layer of photoresist is patterned for the trench etch, due to the difference in etch rate between the two layers of dielectric, the trench of the dual damascene structure is etched without further affecting the via etch in the lower layer of dielectric.

BRIEF DESCRIPTION OF THE DRAWINGS

FIGS. 1 through 3 show a Prior Art procedure for the creation of a dual damascene opening, as follows:

FIG. 1 shows the deposition of a layer of dielectric, the patterning for the via opening of a first layer of photoresist on the surface of the layer of dielectric.

FIG. 2 shows the etching of the via opening into the layer of dielectric and the deposition and patterning for the line pattern of a second layer of photoresist.

FIG. 3 shows the etching of the line patterns and the removal of the layer of photoresist.

FIG. 4 shows the depositing of two layers of dielectric.

FIG. 5 shows the patterning of a first layer of photoresist for the via opening in the two layer of dielectric.

DESCRIPTION OF THE PREFERRED EMBODIMENTS

Figure 6:
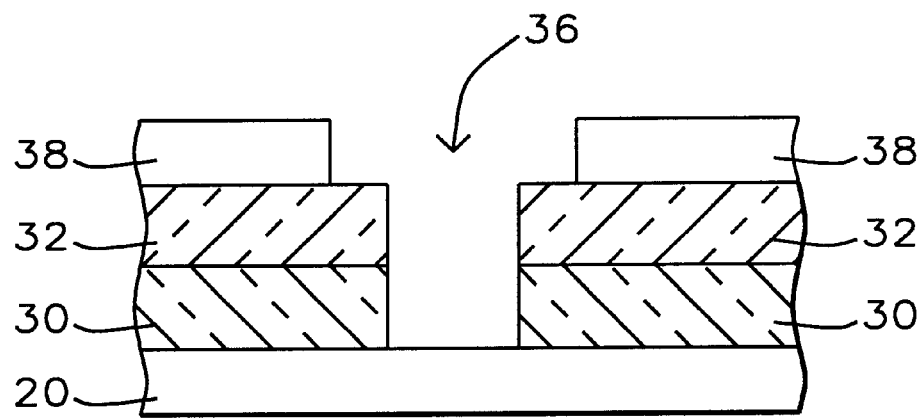
FIG. 6 shows the patterning of a second layer of photoresist for the line pattern in the two layer dielectric.

Referring now to the drawings, particularly to FIGS. 4 through 7, there is shown the sequence of steps that are required to form a dual damascene structure using two layers of dielectric and employing a two layer photoresist process with double photolithography steps. Use is made of the difference in etching rate between the upper layer of dielectric and the lower layer of dielectric whereby the lower layer of dielectric has an etch rate that is lower than the etch rate of the upper layer of dielectric. The result of the difference in etch rate between the two layers of dielectric is that the upper layer will, under the same conditions of exposure and etch processing, be etched faster than the lower dielectric layer. The faster etch rate of the upper layer is used to create the (wider) liner pattern of the dual damascene structure while, at the same time, using the lower etch rate of the lower layer of dielectric as an etch stop when creating the line pattern of the dual damascene structure.

Referring now specifically to FIG. 4, there is shown the deposition of two layers 30 and 32 of dielectric on a semiconductor surface 20. The semiconductor surface 20 is typically the surface of a semiconductor substrate and is preferably silicon.

It is preferred that the bottom layer 30 of dielectric have an etch rate that is lower than the etch rate of upper layer 34 by a measurable amount.

Dielectric layer 30 therefore can contain any suitable dielectric material such as $SiO_2$, Fluorine doped $SiO_2$, USG, Flare, Silk or Black Diamond or any other suitable low-k dielectric material.

Dielectric layer 32 can also contain any suitable dielectric material such as $SiO_2$, Fluorine doped $SiO_2$, USG, Flare, Silk or Black Diamond or any other suitable low-k dielectric material.

The surface of layer 32 is planarized, preferably using a chemical mechanical polishing (CMP) process. Etching back or using capping method are also suitable for planarizing the surface of layer 32.

FIG. 5 shows a first layer 34 of photoresist formed on the surface of the dielectric layer 32.

The layer of photoresist 34 is patterned providing openings that have the width of the via opening of the dual damascene structure that is to be created in the two layers of dielectric. Photoresist layer 34 is, after being deposited, wet developed anisotropically and removed from the surface of the second layer of dielectric where the via opening is to be created.

FIG. 6 shows the completion of the etching of the via opening through both layers of dielectric 30 and 32 thereby creating the via opening. A second layer 38 of photoresist is deposited over the surface of the upper layer 30 of dielectric; this layer is patterned to provide openings that have the width of the line pattern of the dual damascene structure.

Figure 7:
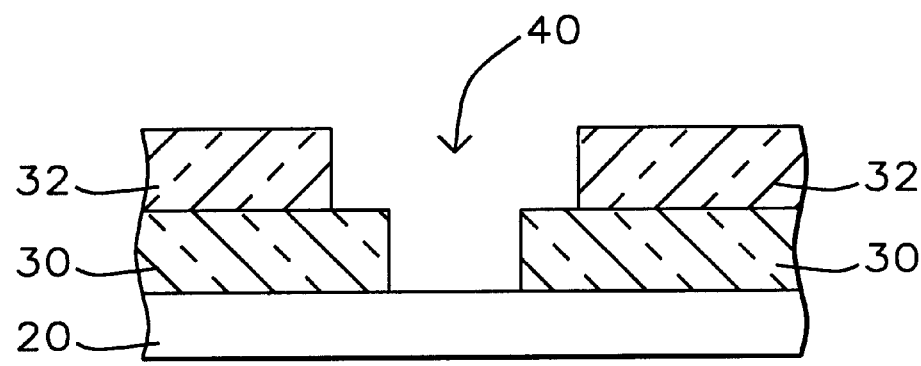
FIG. 7 shows the completed dual damascene opening that has been created in the two layers of dielectric, after removal of the second layer of photoresist.

FIG. 7 shows the results of driving the line pattern that has been created in the second layer of photoresist into the upper layer of dielectric. FIG. 7 shows the dual damascene structure comprising line trench 40 and via opening 42 formed using two layers of dielectric and employing a double photolithography process. The dual damascene metal interconnect is finally formed by depositing metal into the line trench and the via opening in the composite two layer intra-level dielectric. The via opening can be a contact opening or a via opening depending on the nature of the underlying layer, that is whether the underlying layer is the silicon substrate itself or a wiring layer.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of dual damascene patterning through the use of two contiguous dielectric layers, comprising the steps of:

provding a substrate having two contiguous layers of dielectric deposited thereon, said two layers of dielectric comprising a first layer of dielectric and a second layer of dielectric, said first layer of dielectric having been deposited over the surface of said substrate, said second layer of dielectric having been deposited over the surface of said first layer of dielectric, said second layer of dielectric having an etch sensitivity that is larger than an etch sensitivity of said first layer of dielectric by a measurable amount;

forming a first layer of photoresist on the surface of said second layer of dielectric;

hole patterning said first layer of photoresist by exposing and wet developing said first layer of photoresist using a first mask;

etching said two layers of dielectric using said patterned first layer of photoresist as a mask thereby transferring said hole pattern in said first layer of photoresist into said second and into said first layer of dielectric, forming a hole pattern in said first and said second layer of dielectric;

removing said first layer of photoresist;

forming a second layer of photoresist on the surface of said second layer of dielectric;

line patterning said second layer of photoresist by exposing and wet developing said second layer of photoresist using a second mask;

etching said second layer of dielectric using said patterned second layer of photoresist as a mask, transferring said line pattern in said second layer of photoresist into said second layer of dielectric, forming a line pattern in said second layer of dielectric, said line pattern in said second layer of dielectric replacing said hole pattern in said second layer of dielectric;

removing said second layer of photoresist; and depositing metal into said line pattern in said second layer of dielectric and said hole pattern in said first layer of dielectric to form a dual damascene structure and planarizing said two layers of dielectric.

2. The method of claim 1 wherein said two layers of dielectric are planarized by means of Chemical Mechanical Polishing (CMP).

3. The method of claim 1 wherein said first layer of dielectric is selected from the group consisting of $SiO_2$, Fluorine doped $SiO_2$, USG, Flare, Silk or Black Diamond or any other suitable low-k dielectric material, said first layer of dielectric material having a thickness of between 4,000 $\mu$m and 12,000 $\mu$m.

4. The method of claim 1 wherein said second layer of dielectric is selected from the group consisting of $SiO_2$, Fluorine doped $SiO_2$, USG, Flare, Silk or Black Diamond or any other suitable low-k dielectric material, said second layer of dielectric material having a thickness of between 4,000 $\mu$m and 12,000 $\mu$m.

5. The method of claim 1 wherein said first layer of photoresist is deposited to a thickness of between about 1 $\mu$m and 100$\mu$m.

6. The method of claim 1 wherein said second layer of photoresist is deposited to a thickness of between about 1 $\mu$m and 100 $\mu$m.

7. The method of claim 1 wherein said metal deposited to form said dual damascene structure is copper or tungsten or aluminum-copper alloy.

* * * * *